(12) United States Patent
Wu et al.

(10) Patent No.: US 7,978,779 B2
(45) Date of Patent: Jul. 12, 2011

(54) TONE-INTERLEAVED CODED MODULATION SCHEME FOR MIMO OFDM COMMUNICATION

(75) Inventors: Wen-Rong Wu, Hsinchu (TW); Shih-Chi Shen, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 818 days.

(21) Appl. No.: 11/782,528

(22) Filed: Jul. 24, 2007

(65) Prior Publication Data

US 2009/0028253 A1    Jan. 29, 2009

(51) Int. Cl.
   *H04B 7/02*      (2006.01)
   *H04L 1/02*      (2006.01)

(52) U.S. Cl. ....................................... 375/267
(58) Field of Classification Search ............... 375/267
See application file for complete search history.

(56) References Cited

U.S. PATENT DOCUMENTS

| | | | |
|---|---|---|---|
| 6,560,295 B1 | 5/2003 | Hammons, Jr. et al. | 375/299 |
| 6,891,897 B1 | 5/2005 | Bevan et al. | 375/265 |
| 7,095,812 B2 | 8/2006 | Chan et al. | 375/341 |
| 2002/0149496 A1* | 10/2002 | Dabak et al. | 340/825.56 |
| 2005/0278605 A1* | 12/2005 | Xu et al. | 714/758 |
| 2006/0036924 A1 | 2/2006 | Ghosh | 714/790 |
| 2006/0198292 A1* | 9/2006 | Yoshii et al. | 370/208 |
| 2009/0034638 A1* | 2/2009 | Sawahashi et al. | 375/260 |

FOREIGN PATENT DOCUMENTS

JP     2006311359 A   *   11/2006

OTHER PUBLICATIONS

E. Zehavi, "8-PSK Trellis Codes for a Rayleigh Channel", IEEE Transactions on Communications, vol. 40, No. 5, pp. 873-884, May 1992.
B. M. Hochwald and S. ten Brink "Achieving Near-Capacity on a Multiple-Antenna Channel", IEEE Transactions on Communications, vol. 51, No. 3, pp. 389-399, Mar. 2003.
F. Tosato and P. Bisaglia "Simplified soft-output demapper for binary interleaved COFDMZ with application to HIPERLAN/2", IEEE International Conference on Communications, vol. 2, pp. 664-668, 2002.

* cited by examiner

*Primary Examiner* — Dac V Ha
*Assistant Examiner* — Tanmay K Shah
(74) *Attorney, Agent, or Firm* — Alan Kamrath; Kamrath & Associates PA

(57) ABSTRACT

A MIMO OFDM system for TICM includes a tone-level interleaver at the transmitter using a block of $N_T$ symbols as its basic unit. This results in different decoding architectures at the receiver. The main advantage of TICM is to merge soft-bit demapping into the Viterbi algorithm. Taking advantage of the trellis structure inherent in the Viterbi algorithm, TICM can have lower computational complexity and potentially better performance than BICM with the LSD detector and the vector demapper. Although the tone-level interleaving may not have spatial diversity gain, the performance is not affected in 802.11n environments.

6 Claims, 7 Drawing Sheets

TONE-INTERLEAVED CODED MODULATION SCHEME FOR MIMO OFDM COMMUNICATION

BACKGROUND OF THE INVENTION

1. Field of the Invention

The present invention relates to wireless communications. More particularly, the present invention relates to multi-input multi-output (MIMO) orthogonal frequency division multiplexing (OFDM) wireless communications.

2. Description of the Prior Art

Orthogonal frequency division multiplexing (OFDM) technique is known to have high spectrum efficiency and to be robust against inter-symbol interference (ISI) and fading caused by multi-path propagation. Another useful technique is bit-interleaved coded modulation (BICM), which has been widely used in OFDM systems. BICM is used between an encoder and a modulator for eliminating burst errors. Due to fast growth, existing wireless communication systems are not able to meet the demands for transmission bandwidth. Multi-input multi-output (MIMO) technique, by employing multiple transmit and receive antennas, is introduced to provide higher channel capacity which increases approximately linearly with the number of antennas used. Combining with MIMO structure, OFDM systems can further enhance the spectrum efficiency.

FIG. 1 is a block diagram illustrating a conventional MIMO OFDM system for BICM. Referring to FIG. 1, the conventional MIMO OFDM system 1 includes a transmitter 10 and a receiver 20. The transmitter 10 includes $N_T$ transmit antennas $18.1\text{-}18.N_T$, and the receiver 20 includes $N_R$ receive antennas $28.1\text{-}28.N_R$. An MIMO channel is formed among the transmit antennas $18.1\text{-}18.N_T$ and the receive antennas $28.1\text{-}28.N_R$.

At the transmitter 10, information bits are encoded by a convolutional code (CC) encoder 11. The coded bits outputted from the CC encoder 11 may be punctured for variable code rates by a puncturer 12. The coded and punctured bits are parsed to multiple antenna streams by a parser 13 in a round-robin fashion. Each antenna stream is coped with a bit-level interleaver 14.p, a QAM mapper 15.p, a IFFT/GI modulator 16.p, an analog/RF circuit 17.p and a transmit antenna 18.p, where p represents the index of the transmit antenna and $p \in \{1, 2, 3, \ldots, N_T\}$. It is noted that the QAM mapper 15.p and the IFFT/GI modulator 16.p form an OFDM structure.

The bit-level interleaver 14.p formats its input bits in a rectangular array of m rows and n columns as shown in FIG. 2. Referring to FIG. 2, the input bits $\{b_1, b_2, b_3, L, b_{mn}\}$ are read in row-wise and read out column-wise by the bit-level interleaver 14.p. Then, the bit-level interleaver 14.p outputs the interleaved bits $\{b_1, b_{m+1}, b_{2m+1}, L, b_{mn-m+1}, b_2 b_{m+2}, b_{2m+2}, L, b_{mn-m+2}, L, b_{mn}\}$. Referring again to FIG. 1, the interleaved bits are converted into QAM symbols by the QAM mapper 15.p. The QAM symbols are then fed to the IFFT/GI modulator 16.p, arranged into OFDM symbols, and finally transmitted by the analog/RF circuit 17.p.

At the receiver 20, an electromagnetic signal outputted from the transmitter 10 is passed through the MIMO channel and received by the receiver 20. Simply speaking, the receiver 20 is the reverse process of the transmitter 10. For example, the IFFT/GI modulator 16.p inserts guard interval (GI) and then implements inverse FFT (IFFT). However, the FFT/GI demodulator 26.q implements FFT and then removes GI, where q represents the index of the receive antenna and $q \in \{1, 2, 3, \ldots, N_R\}$. The bit-level deinterleaver 24.q formats its input bits in the same rectangular array as shown in FIG. 2, but its input bits are read in column-wise and read out row-wise.

For the equalizer 29, the commonly used equalizers include the zero-forcing (ZF) and minimum mean-square error (MMSE) equalizers. After equalization, the MIMO OFDM system 1 in each tone becomes multiple single-input single-output (SISO) systems. For the Viterbi decoder 21, a one-dimensional soft-bit demapper 25.q for each SISO system is also required. It is conceptually simple and easy to be implemented, but not optimal. This is because after equalization, noise components at the receive antennas $28.1\text{-}28.N_R$ become correlated. Accordingly, the performance of the MIMO OFDM system 1 for BICM can be greatly degraded in typical MIMO channel conditions. A solution to the problem is to apply an optimal multi-dimensional soft-bit demapper. However, its computational complexity is very high.

Recently, a soft detector using a list sphere decoding (LSD) algorithm, called the LSD detector, has been proposed to replace the equalizer 29. The LSD detector provides a list of candidates allowing the bit metrics to be computed with lower complexity. Although the LSD detector can reduce the complexity of the optimal multi-dimensional soft-bit demapper, the computational complexity is still high, and the size of the memory required to save the candidate list is large, particularly when the number of the transmit antennas is large and when the size of the QAM mapper is large.

It would, therefore, be desirable to provide a MIMO OFDM system having lower computational complexity, particularly when the number of the transmitter antennas is large and when the size of the constellation mapper (e.g. QAM mapper) is large.

SUMMARY OF THE INVENTION

The present invention provides a MIMO OFDM system using a tone-interleaved coded modulation (TICM) scheme to reduce the computational complexity of the decoding process.

In one aspect of the invention, the MIMO OFDM system includes a transmitter and a receiver. The transmitter includes a channel encoder, a constellation mapper, a tone-level interleaver, a parser and a plurality of multicarrier modulators. The receiver includes multicarrier demodulators, a tone-level deinterleaver and a channel decoder.

At the transmitter, the channel encoder receives information bits and outputs coded bits. The constellation mapper converts the coded bits into constellation symbols according to constellation mappings. The tone-level interleaver receives the constellation symbols and uses a symbol block of $N_T$ constellation symbols as its basic unit for interleaving, where $N_T$ represents the number of the transmit antennas. The parser parses interleaved symbol blocks and outputs parsed signals to each corresponding transmit antenna. The multicarrier modulators modulate the parsed signals before the parsed signals are transmitted through the transmit antennas.

At the receiver, the multicarrier demodulators demodulate received signals passed through a MIMO channel formed by the transmit and receive antennas. The tone-level deinterleaver deinterleaves the received signals after demodulation and outputs deinterleaved symbol blocks. The channel decoder decodes the deinterleaved symbol blocks. In one embedment, the channel decoder is a Viterbi decoder including a branch metrics calculation unit, an add-compare-select (ACS) unit and a survivor path decoding unit. The branch metrics calculation unit calculates branch metrics according to the deinterleaved symbol blocks and the estimated MIMO channel. The ACS unit performs an ACS operation according to the branch metrics, and the survivor path decoding unit decodes a survived path with maximum likelihood provided by the ACS operation.

Because the MIMO OFDM system for TICM uses a block of $N_T$ symbols as its basic unit for interleaving, it results in different decoding architectures at the receiver. For example, the soft-bit demapping is merged into the Viterbi decoding. TICM scheme can have lower computational complexity and potentially better performance. To further reduce the complexity of TICM, the LSD algorithm has been simplified and its use has been extended in the decoding process.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
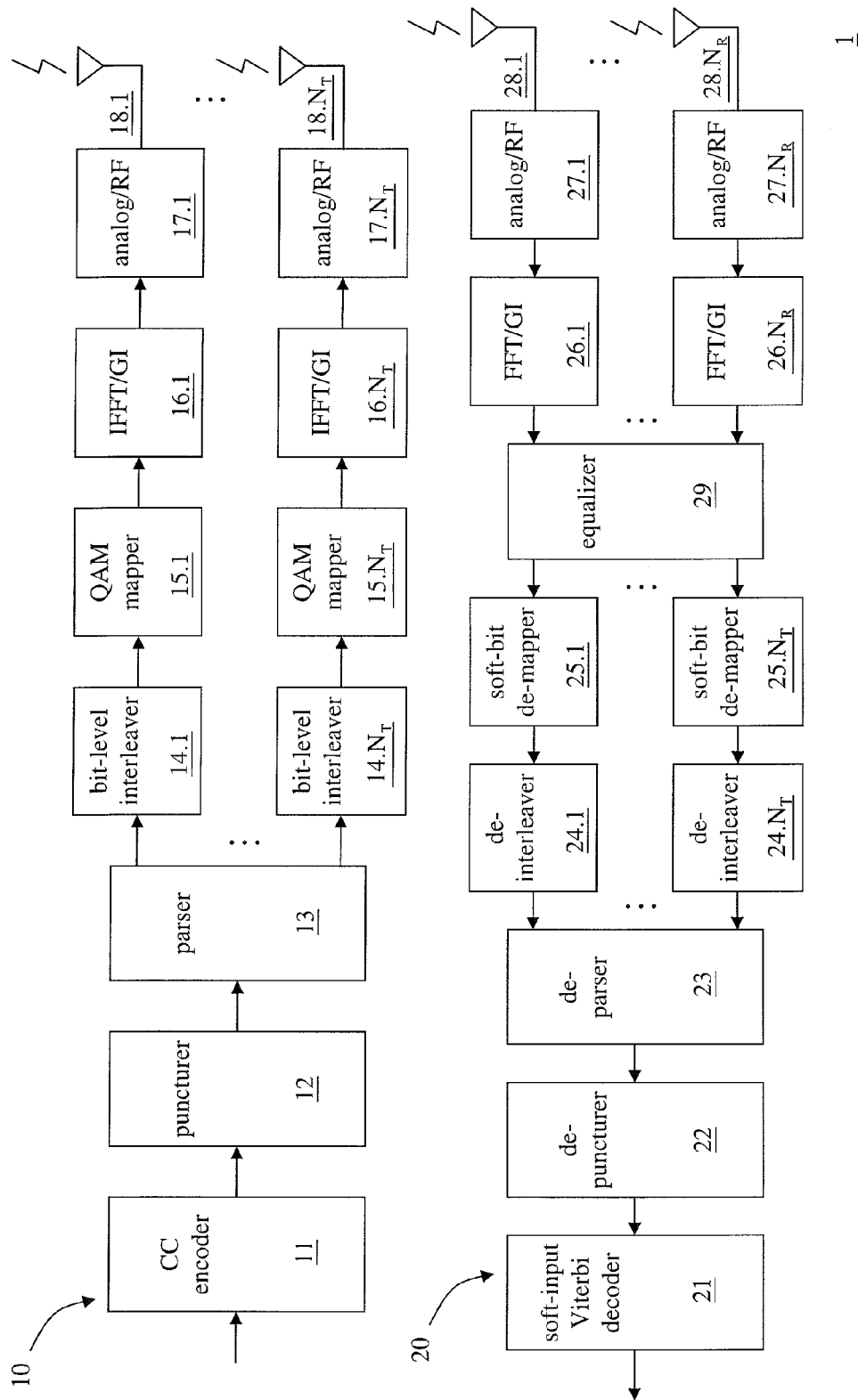
FIG. 1 is a block diagram illustrating a conventional MIMO OFDM system for BICM.
Figure 2:
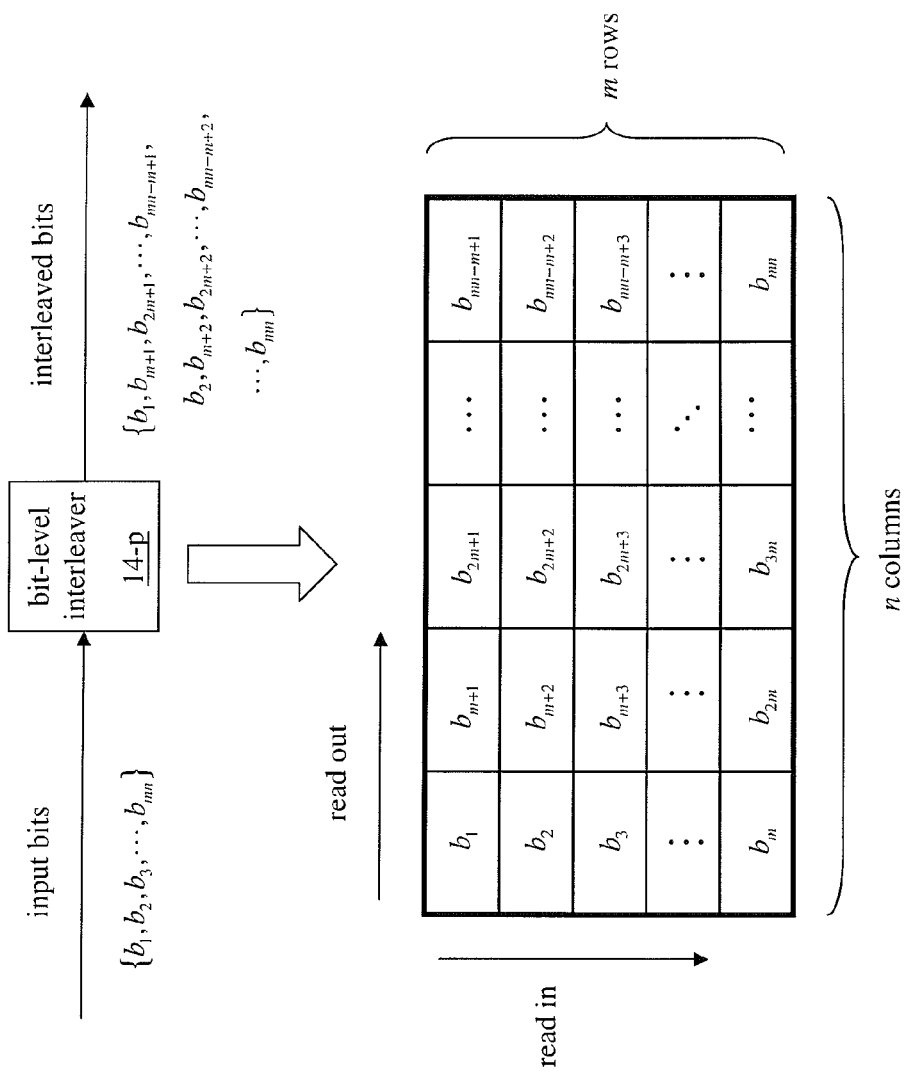
FIG. 2 is a diagram illustrating a conventional bit-level interleaver formatting its input bits in a rectangular array of m rows and n columns.

Reference will now be made in detail to the preferred embodiments of the present invention, examples of which are illustrated in the accompanying drawings. Wherever possible, the same reference numbers are used in the drawings and the description to refer to the same or like parts.

Before the description for the present invention, notations are defined to be used in the sequel. Scalars are denoted in lower case letters, vectors are denoted in lower case bold letters, and matrices are denoted in upper case bold letters. Also, $^T$ and $^H$ the transpose and conjugate transpose of a vector or matrix inside the bracket, respectively. Now, the MIMO OFDM systems for TICM in accordance with the present invention will be described in three subsections I-III as follows.

I. Transmitter and Receiver in the MIMO OFDM Systems for TICM

Figure 3:
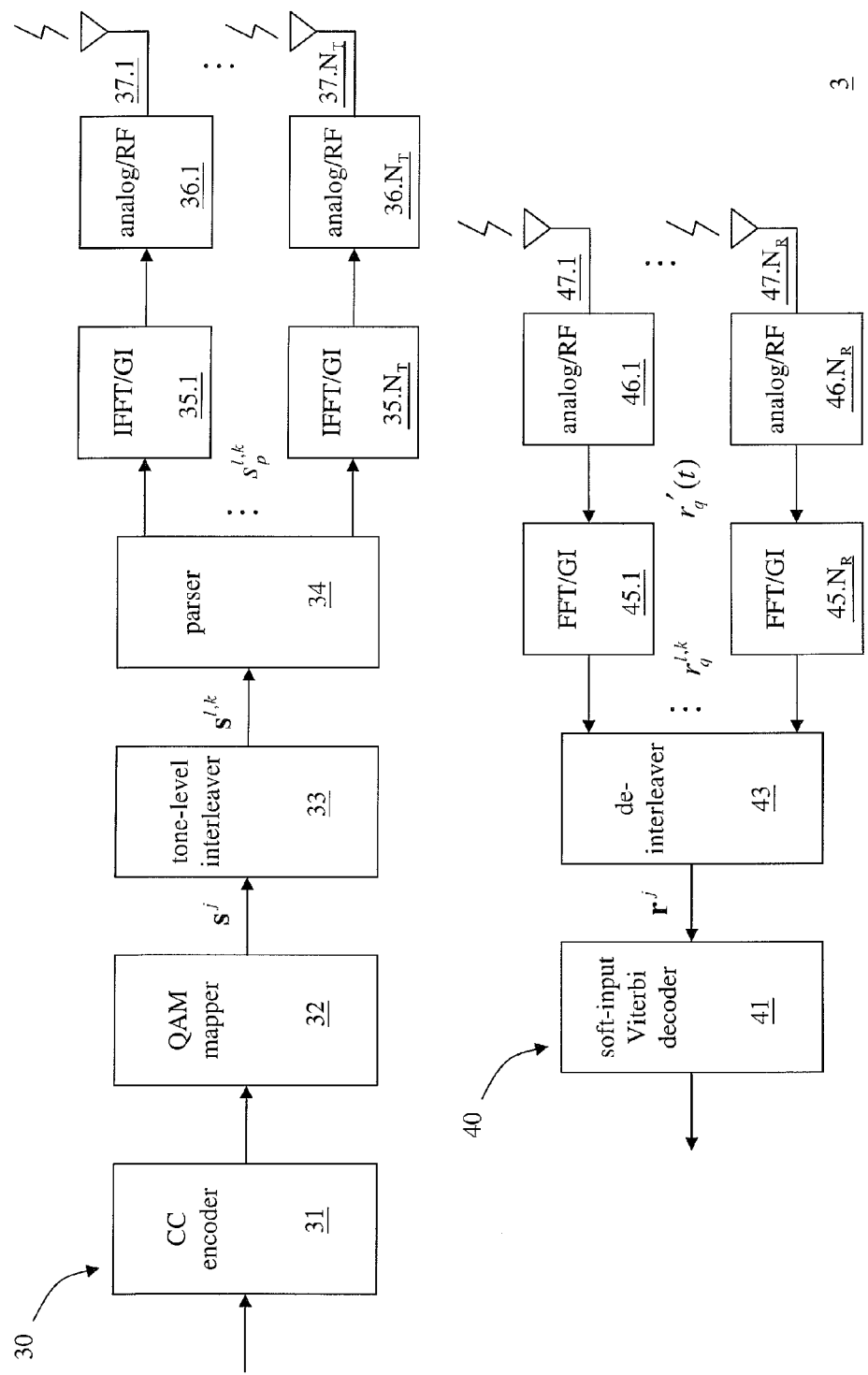
FIG. 3 is a block diagram illustrating a MIMO OFDM system for TICM in accordance with the preferred embodiment of the present invention.

FIG. 3 is a block diagram illustrating a MIMO OFDM system for TICM in accordance with the preferred embodiment of the present invention. Referring to FIG. 3, the MIMO OFDM system 3 includes a transmitter 30 and a receiver 40.

The transmitter 30 includes a channel encoder 31, a constellation mapper 32, a tone-level interleaver 33, a parser 34, multicarrier modulators 35.1-35.$N_T$, analog/RF circuits 36.1-36.$N_T$ and transmit antennas 37.1-37.$N_T$. The receiver 40 includes a channel decoder 41, a tone-level deinterleaver 43, multicarrier demodulators 45.1-45.$N_R$, analog/RF circuits 46.1-46.$N_R$ and receive antennas 47.1-47.$N_R$.

In this embodiment, the channel encoder 31 is a CC encoder, and, accordingly, the channel decoder 41 is a Viterbi decoder. The constellation mapper 32 is a QAM mapper, and accordingly, its output, the constellation symbol, is a QAM symbol. The multicarrier modulator 35.$p$ is an IFFT/GI modulator which first inserts GI and then implements IFFT, and, accordingly, the multicarrier demodulator 45.$q$ is a FFT/GI demodulator which first implements FFT and then removes GI. The analog/RF circuit 36.$p$ may include a digital-to-analog converter, an analog RF filter, an amplifier, and so on, and, accordingly, the analog/RF circuit 46.$q$ may include an amplifier, an analog RF filter, an analog-to-digital converter, and so on.

The MIMO OFDM system 3 employs multiple transmit and receive antennas for data transmission. An MIMO channel is formed among these transmit and receive antennas. It is assumed that the MIMO channel in each tone is quasi-static Rayleigh fading, and there are no inter-symbol interference (ISI) and inter-carrier interference (ICI). Thus, the model for the MIMO OFDM system 3 can be represented as $$r^{l,k}=H^k \cdot s^{l,k}+n^{l,k} \qquad \text{Eq.(1)}$$

where $r^{l,k}=[r_1^{l,k}, L, r_q^{l,k}, L, r_{N_R}^{l,k}]^T$ represents the received vector signal at the $k^{th}$ tone and the $l^{th}$ OFDM symbol after FFT, where q represents the index of the receive antenna and $q \in \{1, 2, 3, \ldots, N_R\}$;

$s^{l,k}=[s_1^{l,k}, L, s_p^{l,k}, L, s_{N_T}^{l,k}]^T$ represents the transmitted vector signal at the $k^{th}$ tone and the $l^{th}$ OFDM symbol before IFFT, where p represents the index of the transmit antenna and $p \in \{1, 2, 3, \ldots, N_T\}$;

$$H^k = \begin{pmatrix} h_{1,1}^k & K & h_{1,N_T}^k \\ M & h_{q,p}^k & M \\ h_{N_R,1}^k & L & h_{N_R,N_T}^k \end{pmatrix}$$

represents the frequency response of the MIMO channel at the $k^{th}$ tone, where the element $\{h_{q,p}^k\}$ represents the coupling between the $p^{th}$ transmit antenna and the $q^{th}$ receive antenna; and $n^{l,k}=[n_1^{l,k}, L, n_q^{l,k}, L, n_{N_R}^{l,k}]^T$ represents the received vector noise, and each element $\{n_q^{l,k}\}$ is an independent and identically distributed (i.i.d.) complex Gaussian random variable with zero mean and variance $\sigma^2 = N_0$.

At the transmitter 30, information bits are first convolutionally encoded by the CC encoder 31, and, then, the resultant coded bits are converted into QAM symbols by the QAM mapper 32. The QAM symbols are interleaved by the tone-level interleaver 33. The parser 34 will parse the transmitted vector signal $s^{l,k}$ to each corresponding transmit antenna 37.$q$. For example, the parsed signal $\{s_p^{l,k}\}$, called the $p^{th}$ transmitted signal of the transmitted vector signal $s^{l,k}$ before IFFT, is sequentially coped with the corresponding IFFT/GI modulator 35.$p$, the corresponding analog/RF circuit 36.$p$ and the corresponding transmit antenna 37.$p$.

One special feature of the MIMO transmitter for TICM is that the channel encoder (e.g. the CC encoder 31) and the constellation mapper (e.g. the QAM mapper 32) can be independently designated without considering the optimum of them. Accordingly, the optimum of the MIMO transmitter for TICM is less than that of the STTC (space time trellis code) transmitter, because at the STTC transmitter, the channel encoder and the constellation mapper are dependently optimally designated. However, the design of the STTC transmitter is more and more difficult, particularly when the number of the transmit antennas is large and when the size of the QAM mapper is large.

The main difference between BICM and TICM lies in the level of interleaving. The bit-level interleaver (e.g. interleaver 14.$p$ as shown in FIG. 1) uses a bit as its basic unit, while the tone-level interleaver (e.g. interleaver 33 as shown in FIG. 3) uses a block of $N_T$ symbols as its basic unit. The $j^{th}$ block (or called symbol block), $s^j=[s_1^j, s_2^j, L, s_{N_T}^j]^T$, consists of $N_T$ modulated symbols, mapped from $N_T \cdot N_{BPSC}$ coded bits, where $N_{BPSC}$ represents the number of bits transmitted per sub-channel at a time instant. The index j starts from "1" to "$L_S \cdot K$", where $L_S$ represents the number of OFDM symbols per transmit antenna, and K represents the number of OFDM sub-channels. Thus, there are total $L_S \cdot K$ blocks at each transmission package.

Figure 4A:
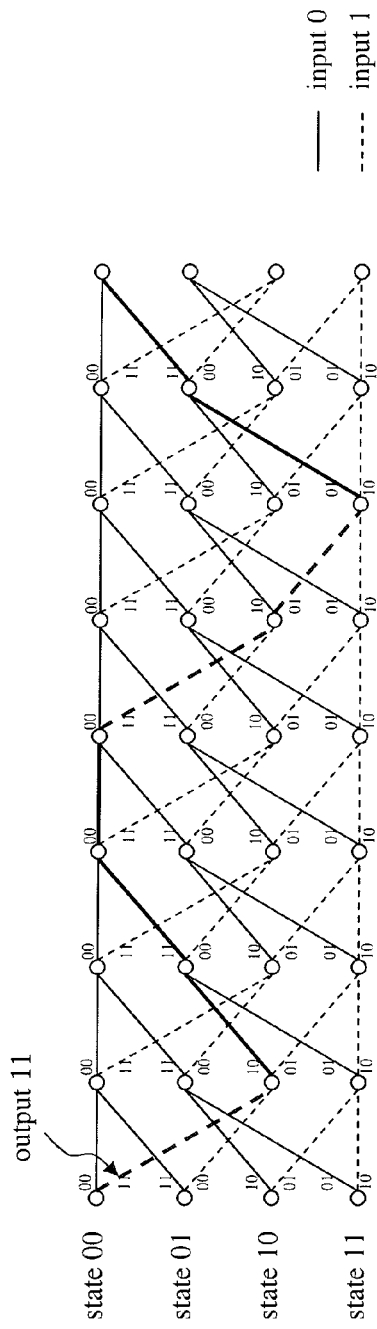
FIG. 4A and 4B are each a trellis diagram at the $j^{th}$ stage for the CC encoder and its re-drawn version respectively.

For example, it is assumed that the CC encoder 31 with $R_c=\frac{1}{2}$ and $K_{CC}=3$ is used, where $R_C$ represents the code rate and $K_{CC}$ represents the constraint length. It is also assumed that 16-QAM mapper 32 and four transmit antennas 37.1-37.4 are used (i.e. the size of the QAM mapper 32 is 16, and $N_T=4$). Encoding process of the CC encoder 31 can be explained in the trellis diagram as shown in FIG. 4A. Referring to FIG. 4A, there are $2^{K_{CC}-1}=4$ possible states. Each state has two incoming and two outgoing branches. A transition from one state to another in response to input (i.e. information bit) "0" is represented by a solid line and in response to input "1" is represented by a dashed line. The binary number labelled on each branch represents the output (i.e. coded bits) of the CC encoder 31 as it moves from one state to another according to the binary input value. Since a block of four QAM symbols are mapped from sixteen coded bits, one stage is defined in the trellis diagram as eight continuous time instants in the trellis diagram. Each stage is also a basic unit in the decoding process at the receiver 40, which is similar to a radix-$2^8$ Viterbi structure.

Figure 4B:
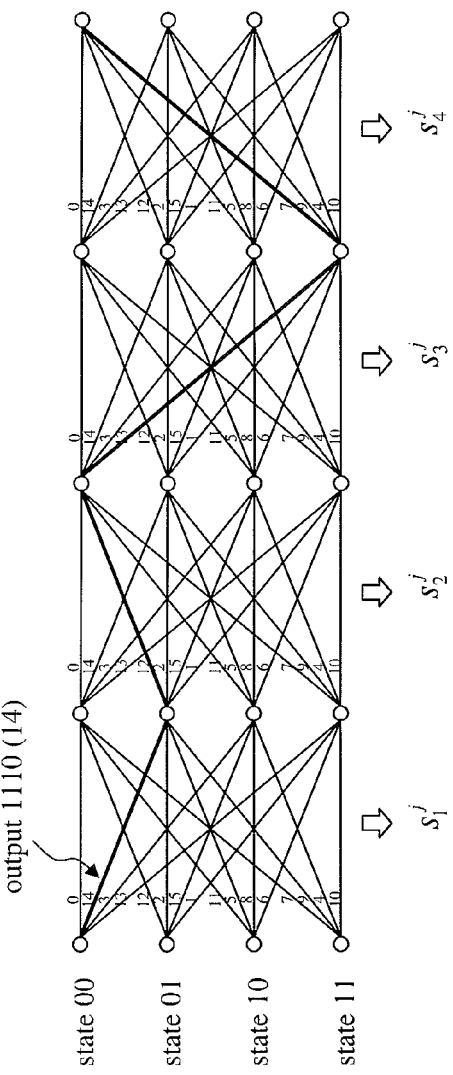

To explain further, FIG. 4A can be re-drawn as that in FIG. 4B if each two consecutive time instants are merged into one. Referring to FIG. 4B, the decimal number, transformed from the binary number, labelled on each branch, represents the output (i.e. coded bits) of the CC encoder 31 as it moves from one state to another. If the coded bits are assumed to be {11 10, 11 00, 11 01, 01 11 } according to FIG. 4A, accordingly, they can be represented as {14, 12, 13, 7} according to FIG. 4B. Now, each time instant in the trellis outputs four coded bits (e.g. "1110" or 14) and the four coded bits are mapped to a 16-QAM symbol (e.g. $s_1^j$). Thus, for four transmit antennas, $s^j=[s_1^j, s_2^j, s_3^j, s_4^j]^T$ represents a block of four QAM symbols associated with the outputs of the CC encoder 31 at the $j^{th}$ stage through the trellis diagram.

At the receiver 20 for BICM, soft-bit values are first computed by the soft-bit demapper 25.$q$, and these values are then used in the soft-bit Viterbi decoder 21 to calculate the branch metrics (BMs). However, at the receiver 40 for TICM, the BMs can be directly computed without involving the soft-bit demapper.

Figure 5:
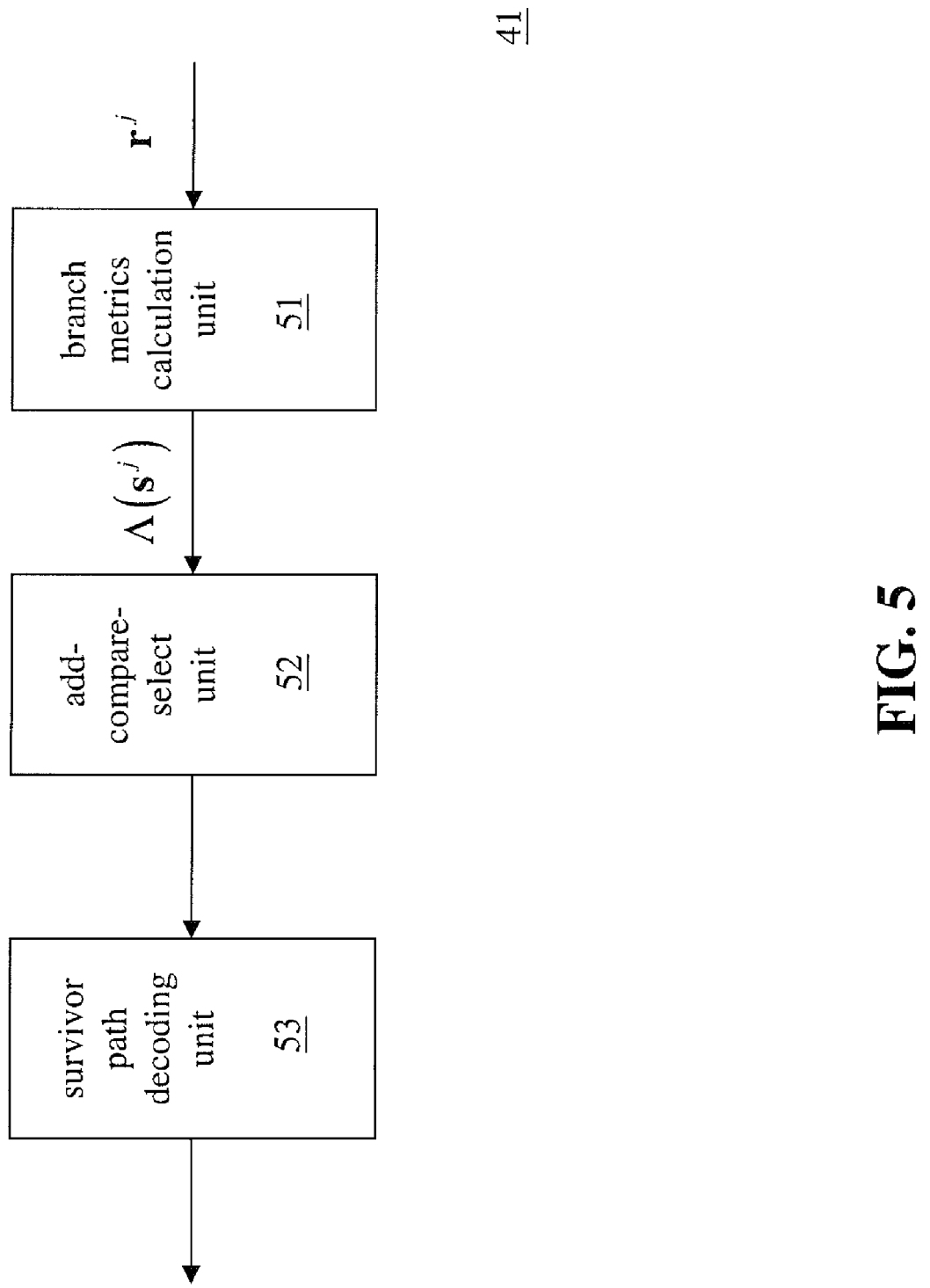
FIG. 5 is a block diagram illustrating a Viterbi decoder at the MIMO OFDM receiver for TICM in accordance with the preferred embodiment of the present invention.

Referring again to FIG. 3, at the receiver 40, the received vector signal $r^{j,k}$ is deinterleaved by the tone-level deinterleaver 43, and the resultant deinterleaved block $r^j$ is passed to the soft-bit Viterbi decoder 41. Referring to FIG. 5, the Viterbi decoder 41 includes three major units: a branch metrics calculation unit 51, an add-compare-select (ACS) unit 52 and a survivor path decoding unit 53. The BMs are calculated by the branch metrics calculation unit 51 according to the deinterleaved block $r^j$ and the estimated MIMO channel through the trellis diagram as shown in FIG. 4B. As mentioned, the whole trellis as shown in FIG. 4B corresponds to one stage. The BMs outputted from the branch metrics calculation unit 51 are fed into the ACS unit 52 to select the state with the greatest state metric. The state metric indicates the greatest accumulated BMs among all legal paths. Finally, the survived path is traced back and decoded by the survivor path decoding unit 53.

Since the conditional probability density function (p.d.f) of the deinterleaved block $r^j$ obeys complex Gaussian distribution, the output symbols corresponding to the maximum likelihood path through the trellis diagram can be defined as $$\Phi^{ML-path} = \underset{\Phi^{trel,j} \in \psi^{trel,j}}{\operatorname{argmax}} \sum_{j=1}^{L_S \cdot K} \left(-|r^j - H^j \cdot \Phi^{trel,j}|^2\right) \quad \text{Eq. (2)}$$

where $r^j=[r_1^j, L, r_{N_R}^j]^T$ represents the deinterleaved block;
$H^j$ represents the frequency response of the MIMO channel after deinterleaving;
$\Phi^{trel,j}=[\phi_1^{trel,j}, L, \phi_{N_T}^{trel,j}]^T$ represents the output symbols corresponding to the hypothesized legal path at the $j^{th}$ stage in the trellis diagram, and
$\Psi^{trel,j}=[\psi_1^{trel,j}, L, \psi_{N_T}^{trel,j}]^T$ presents the subset of the output symbols corresponding to all legal paths at the $j^{th}$ stage in the trellis diagram.

Let $N_{IBPS}=N_T \cdot N_{BPSC} \cdot R_C$ be the number of information bits per stage. Thus, finding the maximum likelihood path needs to examine $2^{K_{CC}-1} \cdot (2^{N_{IBPS}})^{L_S \cdot K}$ paths through the trellis diagram, where $2^{K_{CC}-1}$ represents the number of beginning states in the trellis diagram.

Here the Viterbi algorithm can be used to reduce complexity. Note that the total trellis stages are $L_S \cdot K$. The BM of the block $s^j$ at the $j^{th}$ stage outputted from the branch metrics calculation unit 51 for TICM is defined as $$\Lambda(s^j)=-|r^j-H^j \cdot \Phi^{trel,j}|^2 \quad \text{Eq. (3)}$$

Then, the $i^{th}$ state metric (or called path metric) at the $j^{th}$ stage for TICM is defined as $$M_i(j), \text{ where } i \in \{1, 2, \ldots, 2^{K_{CC}-1}\} \quad \text{Eq. (4)}$$

The state metric indicates the greatest accumulated BMs among all legal paths from the first stage to the $j^{th}$ stage merging to the $j^{th}$ state. Thus, the recursive equation for state metric is $$M_i(j+1) = \max_{i' \in I}\{M_{i'}(j) + \Lambda_{i',i}(s^j)\} \quad \text{Eq. (5)}$$

where $\Lambda_{i',i}(s^j)$ represents the BM over the transition branch form the $i'^{th}$ state to the $i^{th}$ state at the $j^{th}$ stage, and I represents the subset of all states having permissible transition from the previous stage to the $i^{th}$ state at the $j^{th}$ stage.

To compute the state metric, the ACS unit 52 will perform the add-compare-select (ACS) operation. The detailed operation is explained below.
(a) Add: Add new BM to the previous state metric for each path merging to the state.
(b) Compare: Compare the total metric of different paths merging to the state.

(c) Select: Select the path with the greatest metric merging to the state and record both the updated state metric and the survived path.

After $M_i(L_S \cdot K+1)$ is evaluated at the $(L_S \cdot K)^{th}$ stage, the state with the greatest state metric is then selected. Then, the survived path is traced back, from the last stage to the first stage, by the survivor path decoding unit 53. Each detected branch at the $j^{th}$ stage will then output $N_{IBPS}$ information bits. This procedure is called chaining (trace) back. After chaining back, the decoding process is completed.

Observing equation (3), there are $2^{K_{CC}-1} \cdot 2^{N_{IBPS}}$ legal paths through the trellis diagram at the $j^{th}$ stage. In other words, the complexity for evaluating the BM, $\Lambda(s^j)$, grows exponentially with $K_{CC}+N_{IBPS}$. Obviously, direct implementation of equation (3) may not be feasible. Note that $2^{K_{CC}-1}$ corresponds to the number of beginning states at the $j^{th}$ stage, and $2^{N_{IBPS}}$ corresponds to the number of all legal paths starting from each beginning state. In the following subsections, suboptimal approaches will be proposed to reduce the computational complexity. The first one (Subsection II) is to reduce the number of the beginning states, and the second one (Subsection III) is to reduce the number of legal paths being searched.

II. Suboptimal Receiver with State Reduction

Figure 6:
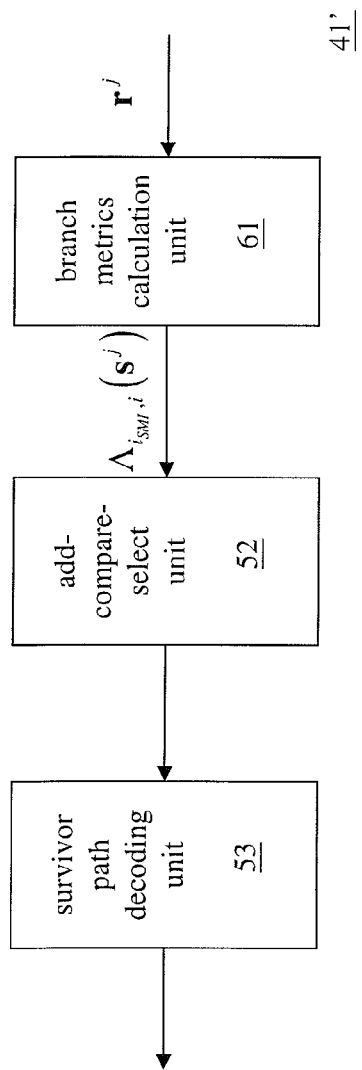
FIG. 6 is a block diagram illustrating an alternative Viterbi decoder at the MIMO OFDM receiver for TICM as shown in FIG. 5.

FIG. 6 is a block diagram illustrating an alternative Viterbi decoder at the MIMO OFDM receiver for TICM. Referring to FIG. 6, the alternative Viterbi decoder 41' includes a suboptimal branch metrics calculation unit 61, the add-compare-select unit 52 and the survivor path decoding unit 53.

Since the BM at each stage for TICM corresponds to a block of $N_T$ symbols, information embedded in the BM is higher than that in BICM (only one bit). Thus, the state metrics in TICM provide more reliable information than that in BICM. The subset of beginning states with the greatest $C_{SMI}$ state metrics is defined as $I_{SMI}$, where $1 \leq C_{SMI} \leq 2^{K_{CC}-1}$. With predictable performance degradation, only the paths beginning from $I_{SMI}$ with higher likelihood can be considered, and the others with lower likelihood can be eliminated. The $i^{th}$ state belonging to $I_{SMI}$ is defined as $i_{SMI}$, and the BM of $s^j$, starting from the $i_{SMI}^{th}$ state and merging to the $i^{th}$ state at the $j^{th}$ stage, is defined as $\Lambda_{i_{SMI},i}(s^j)$. Then, the recursive equation in equation (5) can be modified as $$M_i(j+1) = \max_{i_{SMI} \in I_{SMI}} \{M_{i_{SMI}}(j) + \Lambda_{i_{SMI},i}(s^j)\} \quad \text{Eq. (6)}$$

This suboptimal decoding method is almost the same with the receiver above-mentioned in Subsection I. However, the complexity of the BM evaluation is reduced to a factor of $C_{SMI}/2^{K_{CC}-1}$.

The receiver above-mentioned in Subsection I is now used as an illustration example. Let $C_{SMI}=2$. At the $j^{th}$ decoding stage, suppose that the first and third state have the greatest two state metrics. Then, it is only necessary to evaluate $\Lambda_{1,i}(s^j)$ and $\Lambda_{3,i}(s^j)$, where $i \in \{1, 2, 3, 4\}$. Finally, the ACS module will determine the survived branch. Note that $C_{SMI}$ determines how well equation (6) can approximate equation (5). So, there is a trade off between the computational complexity and performance degradation.

III. Suboptimal Receiver with LSD

Figure 7:
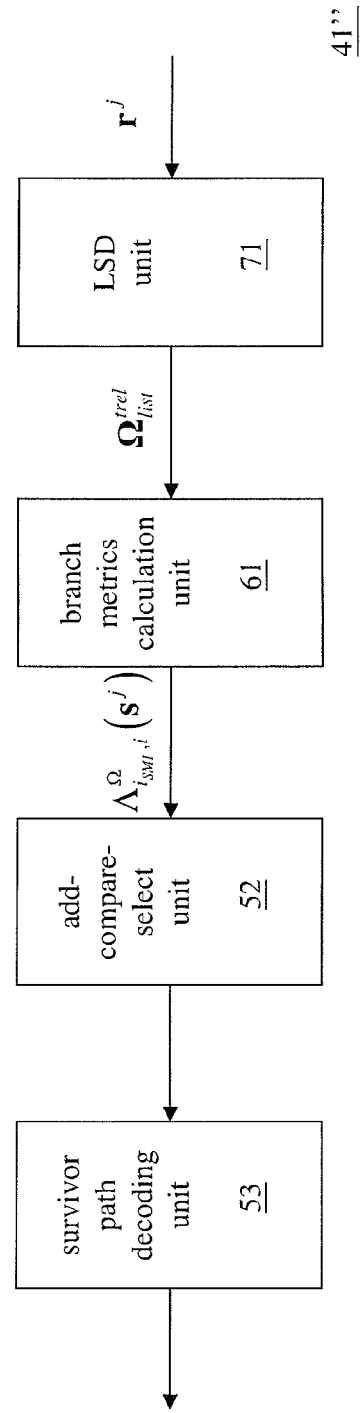
FIG. 7 is a block diagram illustrating another alternative Viterbi decoder at the MIMO OFDM receiver for TICM as shown in FIG. 5.

FIG. 7 is a block diagram illustrating another alternative Viterbi decoder at the MIMO OFDM receiver for TICM. Referring to FIG. 7, the alternative Viterbi decoder 41" includes an LSD unit 71, the sub-optimal branch metrics calculation unit 61, the add-compare-select unit 52 and the survivor path decoding unit 53.

Even reducing the number of the beginning states, there are still $2^{N_{IBPS}}$ legal paths for each beginning state. The computational complexity for evaluating $\Lambda_{i_{SMI},i}(s^j)$ still grows exponentially with $2^{N_{IBPS}}$. Observe equation (3), the BM calculation problem is an ML problem. Thus, the use of the LSD detector can be extended to reduce the computational complexity of the BM calculation. With a tree structure formulation, the symbols corresponding to the hypothesized legal paths can be excluded making $|r^j - H^j \cdot \Phi^{trel,j}|^2$ large. In this way, for the legal paths can be searched for that maximize the term in equation (6). With a suitable number of candidate paths, maximization of equation (6) can be well approximated. The subset of the symbol sequences corresponding to the candidate paths is defined as candidate path list, $\Omega_{list}^{trel}$. Note that the legal paths in the LSD unit 71 here ($2^{N_{IBPS}}$) is much smaller than those in BICM ($2^{N_T \cdot N_{BPSC}}$). This is due to the trellis structure here. So, the BM of $s^j$ that begins from the $i_{SMI}^{th}$ state at the $j^{th}$ stage within $\Omega_{list}^{trel}$ can be represented as $$\Lambda_{i_{SMI}}^\Omega(s^j) = -|r^j - H^j \cdot \Phi^{trel,j}|^2 \quad \text{Eq. (7)}$$

where $\Phi^{trel,j} \in \Psi^{trel,j} \cap \Omega_{list}^{trel}$, and $\Phi^{trel,j} = [\phi_1^{trel,j}, L, \phi_{N_T}^{trel,j}]^T$ represents the output symbols corresponding to the hypothesized legal path starting from the $i_{SMI}^{th}$ state; and $\Psi^{trel,j} = [\psi_1^{trel,j}, L, \psi_{N_T}^{trel,j}]^T$ represents the subset of the output symbols corresponding to all legal paths starting from the $i_{SMI}^{th}$ state.

Then, equation (6) can be modified as $$M_i(j+1) = \max_{i_{SMI} \in I_{SMI}} \{M_{i_{SMI}}(j) + \Lambda_{i_{SMI},i}^\Omega(s^j)\} \quad \text{Eq. (8)}$$

where $\Lambda_{i_{SMI},i}^\Omega(s^j)$ represents the BM over the transition branch from the $i_{SMI}^{th}$ state to the $i^{th}$ state. Thus, to evaluate $\Lambda_{i_{SMI},i}^\Omega(s^j)$, the number of the LSD detectors in the LSD unit 71 needed is $C_{SMI}$. The computational complexity can be greatly reduced with these suboptimal approaches. Referring to the article "Achieving Near-Capacity on a Multiple-Antenna Channel" proposed by B. M. Hochwald and S. ten Brink, the LSD unit 71 only check those points that lie inside a sphere with the given radius $r_{LSD}$, which is large enough to enclose the term maximizing equation (6) and represented as $$\sum_{i=1}^{N_T} (u_{i,i})^2 \cdot \left| \varphi_{N_T+1-i}^{trel} - y_{N_T+1-i} + \sum_{j=i+1}^{N_T} \frac{u_{i,j}}{u_{i,i}} \cdot (\varphi_{N_T+1-i}^{trel} - y_{N_T+1-i}) \right|^2 \leq r_{LSD}^2 \quad \text{Eq. (9)}$$

where $y^j = [y_1, L, y_{N_T}]^T$ represents the equalized vector signal of $r^j$; and $$U = \begin{pmatrix} u_{11} & K & u_{1,N_T} \\ M & u_{i,j} & M \\ 0 & L & u_{N_T,N_T} \end{pmatrix},$$

being obtained by using the Cholesky factorization such that $U^H \cdot U = H^H \cdot H$, represents an upper triangular matrix with $u_{i,i}$ real and positive.

Each term in the summation over i in equation (9) is non-negative, and the LSD method will build a tree structure. With bounds on $\phi_1^{trel,j}, L, \phi_{N_T}^{trel,j}$, the LSD method can eliminate unlikely paths step by step using equation (9).

The dimension of LSD is defined as $N_T$ since there are $N_T$ elements inside each candidate hypothesis. Then, the decoding process of the LSD unit 71, starting from the $i_{SMI}{}^{th}$ state (at the $j^{th}$ stage), can be summarized as follows.

(a) Start the process from $i = N_T$ and eliminate the rest of the terms, $i=1, \ldots, N_T-1$, in the summation over i in equation (9). Then, equation (9) can be modified as $$u_{N_T,N_T}{}^2 \cdot |\phi_1{}^{trel} - y_1|^2 \leq r_{LSD}{}^2 \qquad \text{Eq. (10)}$$

The LSD will choose all possible values for $\phi_1{}^{trel}$ satisfying equation (10) from 104 $_1{}^{trel}$, where $\psi_1{}^{trel}$ is determined by all branches leaving from the $i_{SMI}{}^{th}$ state.

(b) If there is no possible value for $\phi_1{}^{trel}$, go back to (a), and enlarge the radius of the sphere, or choose one of the possible values for $\phi_1{}^{trel}$ and take $i=N_T-1$ into consideration. Then, equation (9) can be modified as $$u_{N_T,N_T}^2 \cdot |\varphi_1^{trel} - y_1|^2 + \qquad \text{Eq. (11)}$$

$$u_{N_T-1,N_T-1}^2 \cdot \left|\varphi_2^{trel} - y_2 + \frac{u_{N_T-1,N_T}}{u_{N_T-1,N_T-1}} \cdot (\varphi_1^{trel} - y_1)\right|^2 \leq r_{LSD}^2 \Rightarrow$$

$$\left|\varphi_2^{trel} - y_2 + \frac{u_{N_T-1,N_T}}{u_{N_T-1,N_T-1}} \cdot (\varphi_1^{trel} - y_1)\right|^2 \leq$$

$$\frac{r_{LSD}^2 - u_{N_T,N_T}^2 \cdot |\varphi_1^{trel} - y_1|^2}{u_{N_T-1,N_T-1}^2}$$

The LSD will choose all possible values for $\phi_2{}^{trel}$ satisfying equation (11) from $\psi_2{}^{trel}$, where $\psi_2{}^{trel}$ is determined by the state that $\phi_1{}^{trel}$ is going to enter.

(c) If there is no possible value for $\phi_2{}^{trel}$, go back to (b) and choose another possible value for $\phi_1{}^{trel}$. A new subset of all possible values for $\phi_2{}^{trel}$ from $\psi_2{}^{trel}$ will be found, or choose one of the possible values for $\phi_2{}^{trel}$ and take $i=N_T-2$ into consideration.

(d) Keep the same process running until LSD reaches $\phi_{N_T}{}^{trel}$. Then, a complete hypothesized transmitted vector signal $\Psi^{trel} = [\psi_1{}^{trel}, L, \psi_{N_T}{}^{trel}]^T$ will be added into the candidate path list. The same process will be repeated until all candidate hypotheses inside the sphere are added into the candidate path list.

Similar LSD from all other states belonging to $I_{SMI}$ needed to be performed at the $j^{th}$ stage until all $\Lambda_{i_{SMI}}{}^{\Omega}(s^j)$ are evaluated. So, equation (7) can be operated at the $j^{th}$ stage.

Figure 8:
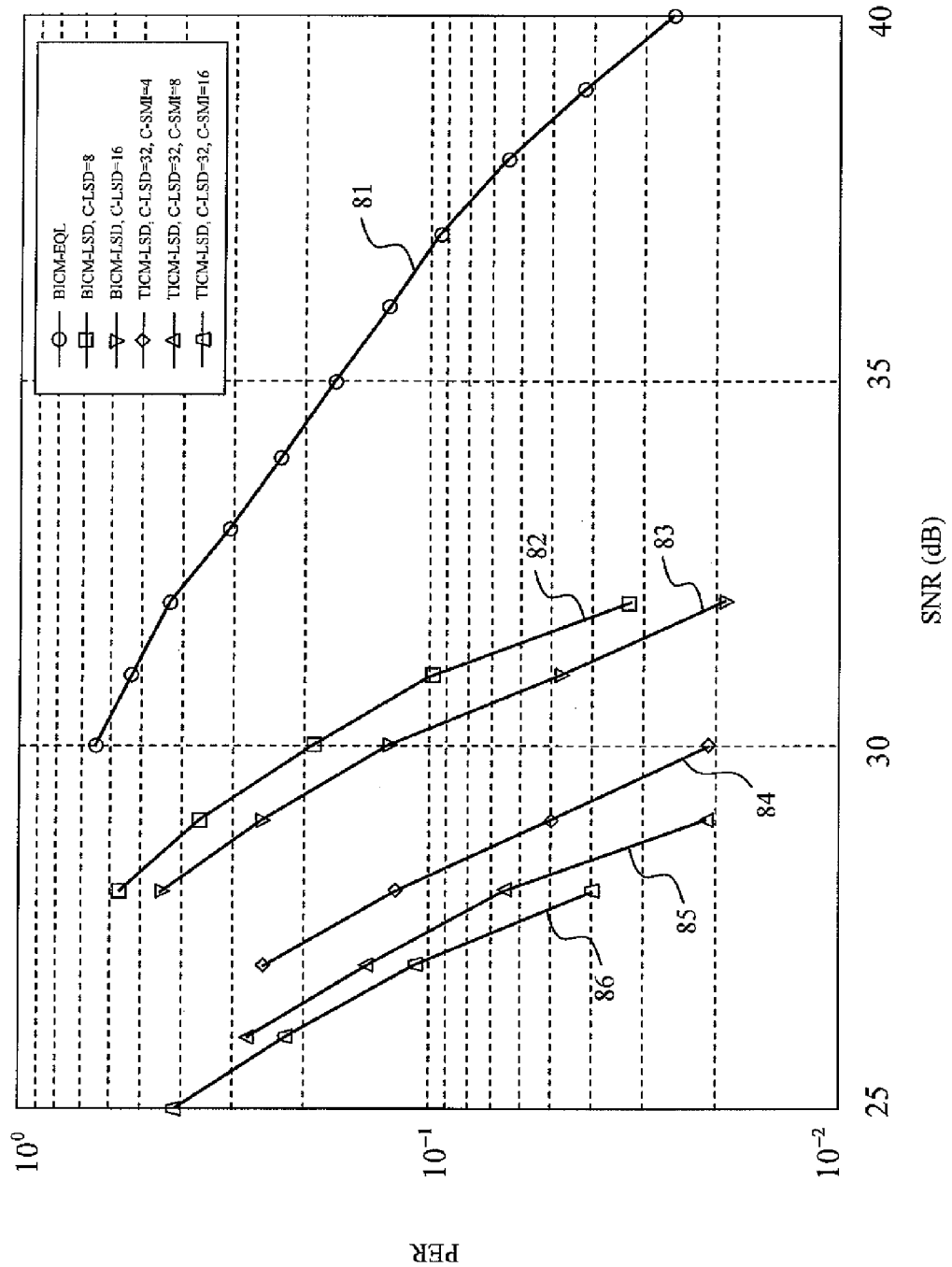
FIG. 8 is a simulation diagram illustrating the performance comparison of the MIMO OFDM receiver for BICM with a MMSE equalizer, the MIMO OFDM receivers for BICM with an LSD detector and a vector demapper, and the MIMO OFDM receivers for TICM as shown in FIG. 7.

FIG. 8 is a simulation diagram illustrating the performance comparison of the MIMO OFDM receiver for BICM with a MMSE equalizer, the MIMO OFDM receivers for BICM with an LSD detector and a vector demapper, and the MIMO OFDM receivers for TICM as shown in FIG. 7. The package error rate (PER) is used as the performance measure. The signal to noise ratio (SNR) is defined as the average received power per receiver antenna divided by the average noise power.

$$SNR = \frac{E\{r_q'(t)\}}{\sigma^2} \qquad \text{Eq. (12)}$$

where $r'_q(t)$ represents the received signal at time t at the $q^{th}$ transmit antenna 47.q.

An IEEE 802.11n proposal released by TGn Sync in July 2005 was used as the system. Note that BICM is used in the proposal. A 4×4 MIMO OFDM system with 64-QAM transmission is considered. The channel-B (non-line-of-sight) with distance 6m was chosen as the simulation environment. It is also assumed that the frequency offset and timing offset are perfectly compensated at the receiver. The preamble for TICM is assumed to be the same for BICM. The typical per-tone channel estimation scheme (no smoothing) is used to estimate the MIMO channels. As the standard testing, PPDU length is set as 1000 bytes, so there are 8000 information bits per package. The radius of the sphere is defined as $r_{LSD}{}^2 = C_{LSD} \cdot N_T \cdot \sigma^2$.

The performance of the system with BICM (81-83) is compared with TICM (84-86). For BICM, two receivers are considered; one with a MMSE equalizer and a 1-D soft-bit demapper (BICM-EQL 81), the other with an LSD detector and a vector demapper (BICM-LSD 82-83). Observing FIG. 8, BICM-EQL 81 performs far worse than BICM-LSD 82-83 and TICM-LSD 84-86. Also, there is about 3dB improvement for TICM-LSD 84-86 compared with BICM-LSD 82-83.

In addition, the computational complexity of the systems with BICM is compared with TICM according to the number of required multiplications for the LSD detector. TABLE 1 shows the average number of required multiplications for four systems —BICM with complex-valued LSD for $C_{LSD}=16$, BICM with real-valued LSD for $C_{LSD}=16$, TICM with complex-valued LSD for $C_{LSD}=32$ and $C_{SMI}=4$, and TICM with complex-valued LSD for $C_{LSD}=32$ and $C_{SMI}=8$ at each stage.

TABLE 1

|  | BICM with complex-valued LSD for $C_{LSD}=16$ | BICM with real-valued LSD for $C_{LSD}=16$ | TICM with complex-valued LSD for $C_{LSD}=32$ and $C_{SMI}=4$ | TICM with complex-valued LSD for $C_{LSD}=32$ and $C_{SMI}=8$ |
|---|---|---|---|---|
| SNR = 27 (dB) | 1.80E+05 | 4.71E+04 | 2.44E+03 | 4.79E+03 |
| SNR = 30 (dB) | 5.45E+04 | 1.08E+04 | 1.19E+03 | 2.30E+03 |
| SNR = 33 (dB) | 1.67E+04 | 3.08E+03 | 0.68E+03 | 1.28E+03 |

Referring to TABLE 1 and FIG. 8, the average number of multiplications for BICM with real-valued LSD is lesser than that with complex-valued LSD. Note that the sphere of the LSD detector in TICM needs to be larger than that in BICM. So, let $C_{LSD}$ for TICM be twice of $C_{LSD}$ for BICM. Also, it can be seen that the average number of multiplication for TICM with $C_{SMI}=8$ ranges from 0.25 and 0.1 of that for BICM with real-valued LSD for PER=0.1 to PER=0.001.

In summary, the MIMO OFDM system for TICM uses a block of $N_T$ symbols as its basic unit for interleaving. This results in different decoding architectures at the receiver. The main advantage of TICM is to merge soft-bit demapping into the Viterbi algorithm. Taking advantage of the trellis structure inherent in the Viterbi algorithm, TICM can have lower computational complexity and potentially better performance than BICM with the LSD detector and the vector demapper. To further reduce the complexity of TICM, the LSD algorithm is simplified and its use is extended in the decoding process. Although the tone-level interleaving may not have spatial diversity gain, the performance is not affected in 802.11n environments.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

We claim:

1. A Multiple Input Multiple Output (MIMO) Orthogonal Frequency Division Multiplexing (OFDM) system employing $N_T$ transmit antennas and $N_R$ receive antennas for data transmission wherein $N_T$ and $N_R$ are each an integer greater than 1, the MIMO OFDM system comprising a MIMO OFDM receiver comprising:
   multicarrier demodulators for demodulating received signals passed through a MIMO channel formed by the transmit and receive antennas, wherein the received signals are interleaved by using a symbol block of Nr constellation symbols as its basic unit;
   a tone-level deinterleaver for deinterleaving the received signals after demodulation and for outputting deinterleaved symbol blocks; and
   a channel decoder for decoding the deinterleaved symbol blocks, wherein the channel decoder is a Viterbi decoder, wherein the Viterbi decoder comprises:
   a List Sphere Decoding (LSD) unit for using an LSD algorithm to obtain a candidate path list including candidate paths;
   a suboptimal branch metrics calculation unit for calculating branch metrics belonging to paths beginning from the subset of beginning states with the greatest state metrics within the candidate path list according to the deinterleaved symbol blocks and the estimated MIMO channel;
   an add-compare-select (ACS) unit for performing an ACS operation according to the branch metrics; and
   a survivor path decoding unit for decoding a survived path with maximum likelihood provided by the ACS operation.

2. The MIMO OFDM system according to claim 1 further comprising
   a transmitter comprising:
   a channel encoder for receiving information bits and outputting coded bits;
   a constellation mapper for converting the coded bits into constellation symbols according to constellation mappings;
   a tone-level interleaver for receiving the constellation symbols and using a symbol block of $N_T$ constellation symbols as its basic unit for interleaving;
   a parser for parsing interleaved symbol blocks and outputting parsed signals to each corresponding transmit antenna; and
   multicarrier modulators for modulating the parsed signals before the parsed signals are transmitted through the corresponding transmit antennas.

3. The MIMO OFDM system according to claim 2, wherein the channel encoder is a conventional code (CC) encoder.

4. A Multiple Input Multiple Output (MIMO) Orthogonal Frequency Division Multiplexing (OFDM) system employing $N_T$ transmit antennas and $N_R$ receive antennas for data transmission wherein $N_T$ and $N_R$ are each an integer greater than 1, the MIMO OFDM system comprising a MIMO OFDM receiver comprising:
   multicarrier demodulators for demodulating received signals passed through a MIMO channel formed by the transmit and receive antennas, wherein the received signals are interleaved by using a symbol block of Nr constellation symbols as its basic unit;
   a tone-level deinterleaver for deinterleaving the received signals after demodulation and for outputting deinterleaved symbol blocks; and
   a channel decoder for decoding the deinterleaved symbol blocks, wherein the channel decoder is a Viterbi decoder, wherein the Viterbi decoder comprises:
   an List Sphere Decoding (LSD) unit for using an LSD algorithm to obtain a candidate path list including candidate paths;
   a branch metrics calculation unit for calculating branch metrics belonging to paths within the candidate path list according to the deinterleaved symbol blocks and the estimated MIMO channel;
   an add-compare-select (ACS) unit for performing an ACS operation according to the branch metrics; and
   a survivor path decoding unit for decoding a survived path with maximum likelihood provided by the ACS operation.

5. The MIMO OFDM system according to claim 4 further comprising a transmitter comprising:
   a channel encoder for receiving information bits and outputting coded bits;
   a constellation mapper for converting the coded bits into constellation symbols according to constellation mappings;
   a tone-level interleaver for receiving the constellation symbols and using a symbol block of $N_T$ constellation symbols as its basic unit for interleaving;
   a parser for parsing interleaved symbol blocks and outputting parsed signals to each corresponding transmit antenna; and
   multicarrier modulators for modulating the parsed signals before the parsed signals are transmitted through the corresponding transmit antennas.

6. The MIMO OFDM system according to claim 5, wherein the channel encoder is a conventional code (CC) encoder.

* * * * *